United States Patent [19]

Jallen et al.

[11] Patent Number: 4,692,898
[45] Date of Patent: Sep. 8, 1987

[54] BUBBLE MEMORY BIAS FIELD STRUCTURE

[75] Inventors: Gale A. Jallen, Roseville; Gene P. Bonnie, Bloomington, both of Minn.

[73] Assignee: Control Data Corp., Minneapolis, Minn.

[21] Appl. No.: 204,728

[22] Filed: Nov. 6, 1980

[51] Int. Cl.$^4$ .............................................. G11C 19/08
[52] U.S. Cl. .......................................... 365/27; 365/2
[58] Field of Search ...................................... 365/2, 27

[56] References Cited

U.S. PATENT DOCUMENTS 3,864,671  2/1975  Myer ....................................... 365/2
4,530,072  7/1985  Jallen ..................................... 365/27

FOREIGN PATENT DOCUMENTS 2811088  9/1978  Fed. Rep. of Germany .......... 365/2
  72638  6/1979  Japan ..................................... 365/2
 156438 12/1979  Japan ..................................... 365/2

OTHER PUBLICATIONS

IBM Technical Disclosure Bulletin—vol. 15, No. 5, Oct. 1972, p. 1602.
IBM Technical Disclosure Bulletin—vol. 13, No. 11, Apr. 1971, p. 3219.
IEEE Transactions on Magnetics—vol. Mag-12, No. 6, Nov. 1976, pp. 645-647.

Primary Examiner—James W. Moffitt
Attorney, Agent, or Firm—William J. McGinnis; J. A. Genovese

[57] ABSTRACT

A bias magnet for a bubble memory device is comprised of a single material low permeability magnet contoured to enhance the magnetic field in the central area of the magnet and is adapted to be slightly larger than the bubble memory chip and in thermal contact therewith, the entire bubble memory chip and bias magnet structure to be surrounded by the rotating magnetic field drive coil structure.

3 Claims, 1 Drawing Figure

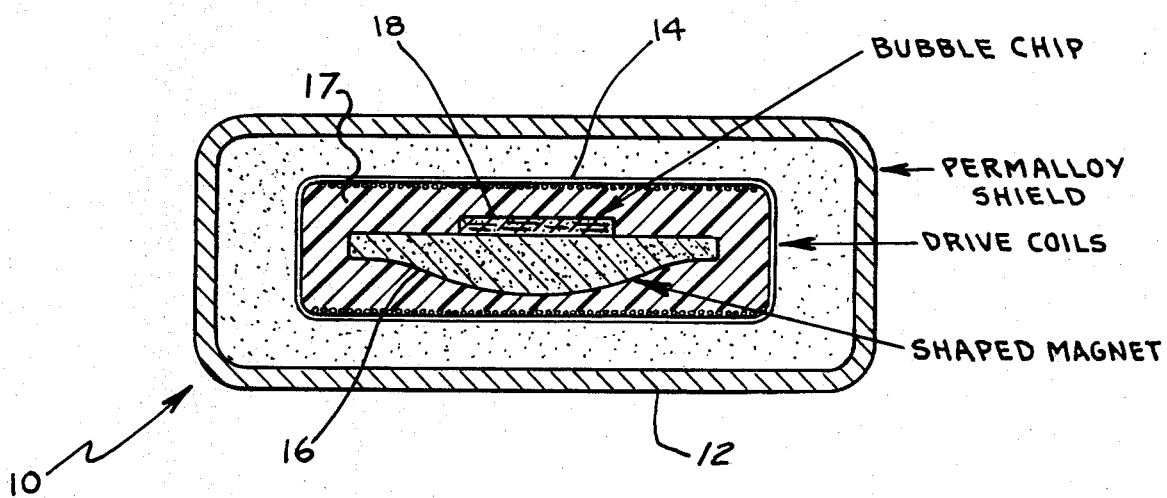

BUBBLE MEMORY BIAS FIELD STRUCTURE

CROSS REFERENCE TO RELATED PATENT APPLICATIONS

This patent application is related to the subject matter disclosed and claimed in patent application Ser. No. 102,096 filed Dec. 10, 1979, now U.S. Pat. No. 4,530,072, entitled "BUBBLE MEMORY BIAS FIELD STRUCTURE", with Gale A. Jallen as the applicant and assigned to the same assignee as the present application.

BACKGROUND OF THE INVENTION

The present application relates to a magnet structure to create the bias magnetic field in a bubble memory device. More particularly, the present invention consists of a single bias field magnet made of a single material and in thermal contact with the bubble memory chip, the entire structure being placed within the rotating field drive coils of a bubble memory device.

Prior art magnetic bubble memory devices require a pair of magnets, each associated with a high permeability leveling plate, within a shielding structure and having the bubble memory chip and rotating magnetic field drive coils located within the magnet structure. The drive coil structure is the principal source of heat because of the high frequency resistive losses in the wires that surround the chip. The temperature compensation needed by the chip (normally provided by the permanent magnet's similar temperature coefficient) is impeded by the interstitial placement of the leveling plate, causing a temperature gradient between chip and magnet.

Therefore, an object of the present invention is to eliminate the high permeability leveling plate and to create a more compact bias field magnet for a bubble memory device.

SUMMARY OF THE INVENTION

The present invention is comprised of a bubble memory bias field magnet made of a single material and contoured to provide a comparitively uniform bubble memory bias magnetic field. The single magnet required with the present invention can be preferably in thermal contact with the bubble memory chip. The low permeability magnet, according to the present invention, can be within the drive coil structure and in contact with the bubble memory chip because the drive coil frequency will not cause hysteresis losses and field distortion in the low permeability material. Preferably, a low permeability material such as barium ferrite or strontium ferrite material having a permeability only slightly greater than that of air may be used for the magnet structure. By having the magnet of a material which is similar in thermal characteristics to that of the bubble memory chip and having the two components in thermal contact, the characteristic stability of bubble memory device according to the present invention is improved.

IN THE SINGLE DRAWING FIGURE

The single drawing FIGURE is a cross-sectional diagrammatic representation of a bubble memory device employing a bias field magnet according to the present invention.

DESCRIPTION OF THE PREFERRED EMBODIMENT

Referring now to the single drawing FIGURE, a bubble memory device 10 has an outer package 12 which consists of a magnetic field shielding material to both shield the bubble memory device from external stray magnetic fields and to prevent the emission of magnetic fields from the bubble memory device. The well known drive coil structure which generates a rotating magnetic field to move the magnetic bubbles on the bubble memory chip is schematically shown in outline form by coil structure 14.

A bubble memory bias field magnet 16 according to the present invention is provided in thermal contact with a bubble memory chip 18. The chip 18 and the magnet 16 do not necessarily have to be secured or adhered to one another. The packaging arrangement by itself may be designed sufficiently to maintain the thermal contact between magnet 16 and chip 18. Thus an appropriate plastic mold 17 may support the chip 18 and the magnet 16 within coil structure 14.

A bias field magnet 16 according to the present invention should be of a low permeability material. In particular, the material for magnet 16 may be a ceramic material such as barium ferrite or strontium ferrite having a permeability not much greater than that of air. Also, the magnet may consist of a rubber or plastic material with suspended magnetic material, such as barium ferrite, in a composition. In order to prevent demagnetizing effects from weakening the magnetic field of magnet 16 in the central area, the magnet 16 is contoured in such a fashion to enhance the magnetic field in the central area of the magnet and compensate for demagnetizing effects.

The contoured surface results in a greater thickness or effective length of the magnet in the central area of the magnet. This contouring results in an enhanced magnetic field in the central area of the magnet so that the entire field seen by the bubble chip 18 may be comparatively uniform. In addition, the edges of magnet 16 extend somewhat beyond the edges of bubble chip 18 to create a more uniform magnetic field at the edge of the chip.

The surface of magnet 16 in thermal contact with chip 18 is formed in a surface complementary to the magnet surface so that the two pieces are generally in continuous thermal contact. This surface is normally comparatively flat while the contoured surface of the magnet 16 is on the side opposite the side in contact with the chip 18. By maintaining the thermal contact between chip 18 and magnet 16, the stability characteristics of the bubble memory device are enhanced. For example, there is less relative change in magnetic field intensity between chip and magnet (assuming similar temperature coefficients) and there is no relative movement changing the distance between the magnet 16 and the chip 18 caused by expansion or contraction during heating and cooling as would occur in the prior art. In addition, by packaging the magnet and the chip in thermal contact, the shifting or misalignment of the packaging structure during use and operation could not effect the magnetic field experienced by the chip 18 during operation. The placing of the magnet 16 in contact with the chip 18 permanently establishes the magnetic field strength and eliminates the temperature gradient and distance variables that effects stability.

The entire disclosure of copending patent application Ser. No. 102,096, owned by the same assignee as is the present application is hereby incorporated in its entirety by reference. The copending application provides further information with respect to the contouring and shaping of bias magnet structures in connection with bubble memory devices.

A particular advantage of the present invention is that using a contoured magnet to create a uniform magnetic field and thereby eliminating the leveling plate which is used in the prior art to establish a uniform magnetic field, the magnet can be placed inside the drive coil structure and in thermal contact with the bubble memory chip. The high permeability leveling plate of the prior art could not be placed within the drive coil structure because of the high heat load generated as a result of hysteresis losses in the high permeability material.

What is claimed is:

1. A bubble memory structure comprised of:
a magnetic field shielding structure,
means for generating a rotating magnetic field within said magnetic field shielding structure,
a bubble memory chip, and
a magnet for generating a bias magnetic field for said bubble memory chip, said magnet consisting of a single element permanent plate magnet of low permeability material placed in continuous, physical, thermal contact with said bubble memory chip and within said means for generating a rotating magnetic field, said magnet further characterized by having a contoured surface disposed opposite a comparatively flat surface in continuous, physical, thermal contact with said bubble memory chip, said contoured surface creating a thicker magnet structure in the central area of the bubble memory chip so that an enhanced magnetic field is created locally and the magnetic field is essentially uniform over the entire bubble memory device and the magnetic field is stronger in the central area of said magnet than that which would be produced in a uniformly thick device.

2. The structure of claim 1 wherein said magnet is comprised of barium ferrite.

3. The structure of claim 1 wherein said magnet is comprised of strontium ferrite.

* * * * *